United States Patent
Chen et al.

(10) Patent No.: US 9,761,494 B2
(45) Date of Patent: Sep. 12, 2017

(54) SEMICONDUCTOR STRUCTURE AND METHOD OF FORMING THE SAME

(75) Inventors: Po-Yu Chen, Baoshan Township (TW); Wan-Hua Huang, Hsinchu (TW); Jing-Ying Chen, Hsinchu (TW); Kuo-Ming Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 13/465,885

(22) Filed: May 7, 2012

(65) Prior Publication Data

US 2013/0292781 A1  Nov. 7, 2013

(51) Int. Cl.
*H01L 21/8234* (2006.01)
*H01L 29/78* (2006.01)
*H01L 29/06* (2006.01)
*H01L 21/768* (2006.01)

(52) U.S. Cl.
CPC .............. *H01L 21/823425* (2013.01); *H01L 21/76895* (2013.01); *H01L 21/823475* (2013.01); *H01L 29/0603* (2013.01); *H01L 29/7833* (2013.01)

(58) Field of Classification Search
CPC ........... H01L 29/4238; H01L 29/66681; H01L 29/7816; H01L 29/7833; H01L 21/823425
USPC ....................................................... 257/336
See application file for complete search history.

(56) References Cited

U.S. PATENT DOCUMENTS

| 6,013,547 | A | 1/2000 | Liaw | |
|---|---|---|---|---|
| 6,020,231 | A | 2/2000 | Wang et al. | |
| 6,281,549 | B1* | 8/2001 | Davies | 257/343 |
| 6,541,318 | B2 | 4/2003 | Sanfilippo | |
| 2003/0141555 | A1* | 7/2003 | Liaw et al. | 257/388 |
| 2004/0217418 | A1* | 11/2004 | Imam et al. | 257/341 |
| 2005/0164493 | A1* | 7/2005 | Liaw | H01L 27/1104 438/637 |
| 2006/0189088 | A1* | 8/2006 | Cho | H01L 21/28518 438/309 |
| 2008/0061379 | A1* | 3/2008 | Chen et al. | 257/382 |
| 2008/0153239 | A1* | 6/2008 | Su et al. | 438/302 |
| 2009/0008710 | A1* | 1/2009 | Wei et al. | 257/337 |
| 2009/0221118 | A1* | 9/2009 | Chen et al. | 438/275 |
| 2010/0102386 | A1* | 4/2010 | You | 257/336 |
| 2010/0308405 | A1* | 12/2010 | Cai | H01L 29/0847 257/347 |

* cited by examiner

*Primary Examiner* — Matthew Landau
*Assistant Examiner* — Mark Hatzilambrou
(74) *Attorney, Agent, or Firm* — Hauptman Ham, LLP

(57) ABSTRACT

A semiconductor structure includes a gate structure disposed on a substrate. At least one lightly doped region adjoins the gate structure in the substrate. The at least one lightly doped region has a first conductivity type. A source feature and a drain feature are on opposite sides of the gate structure in the substrate. The source feature and the drain feature have the first conductivity type. The source feature is in the at least one lightly doped region. A bulk pick-up region adjoins the source feature in the at least one lightly doped region. The bulk pick-up region has a second conductivity type.

18 Claims, 13 Drawing Sheets

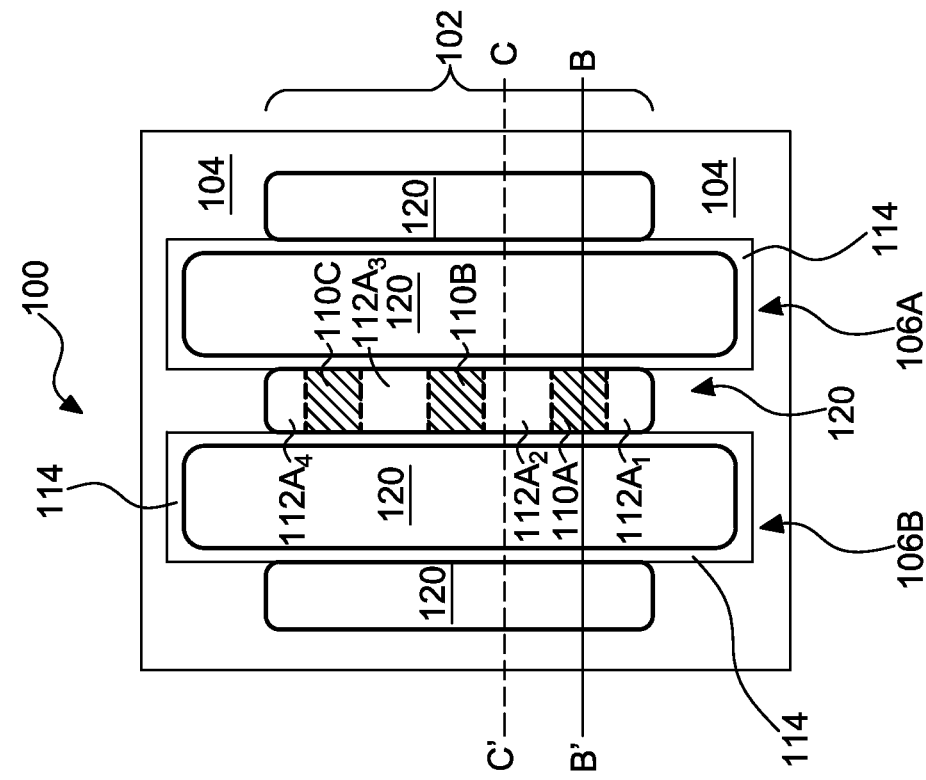
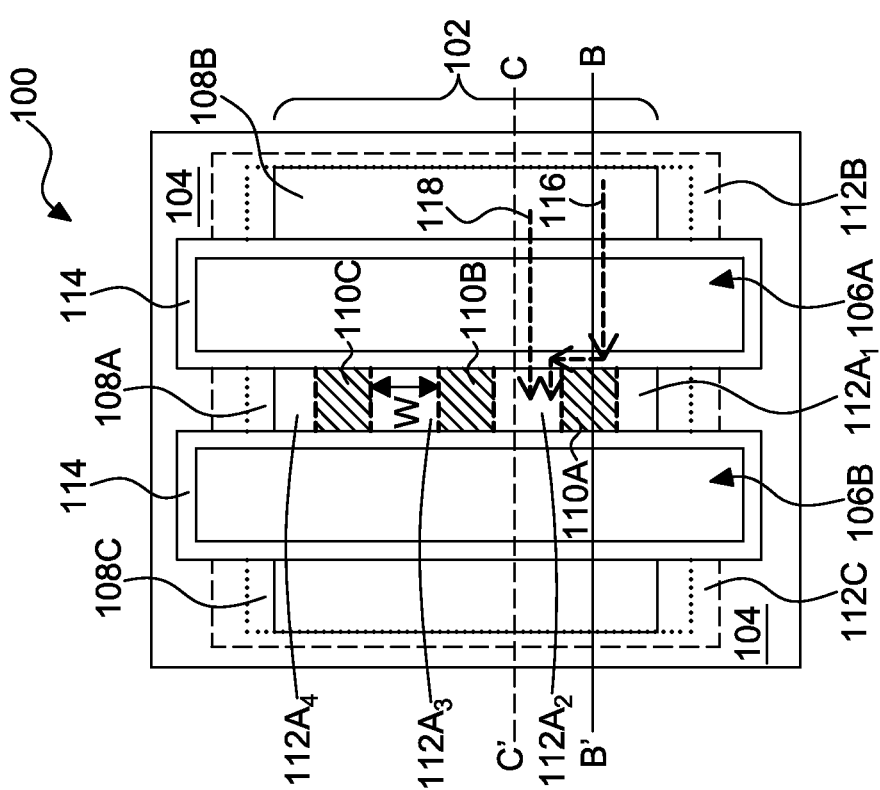

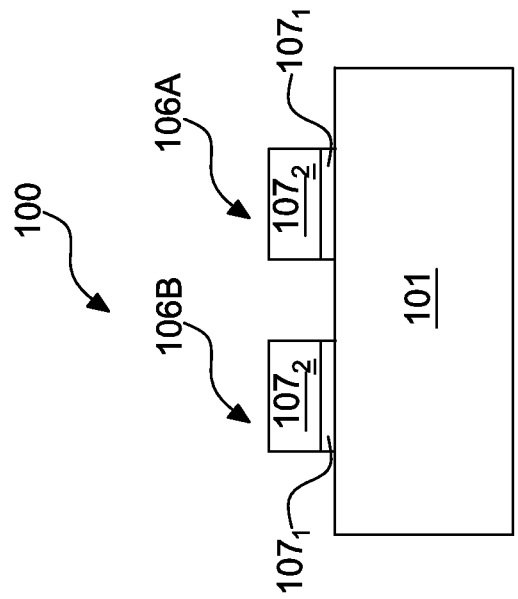
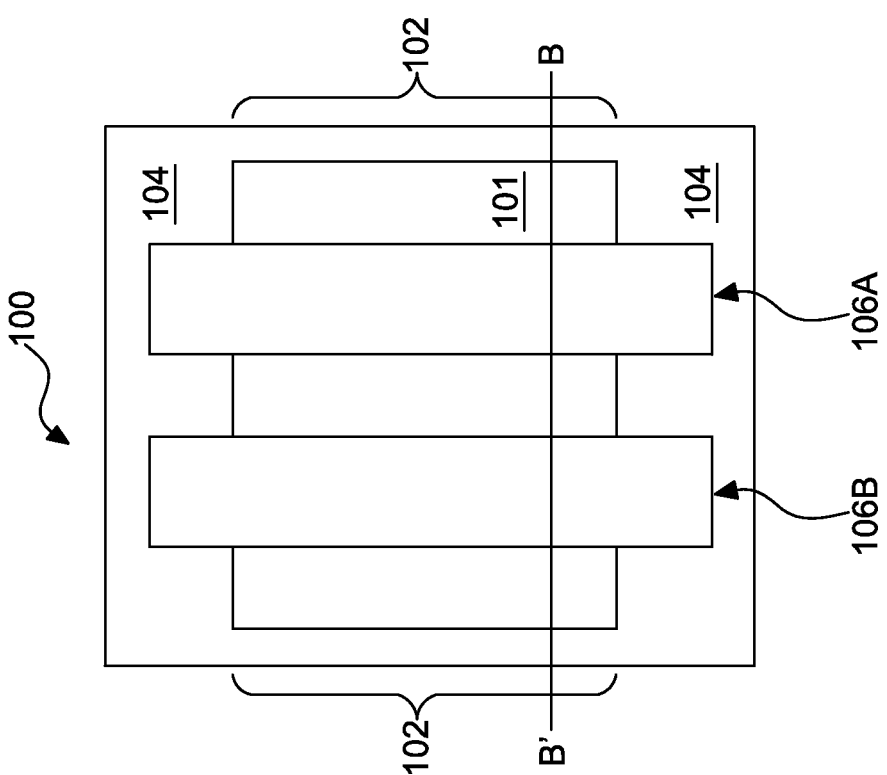
Fig. 7B
Fig. 7A

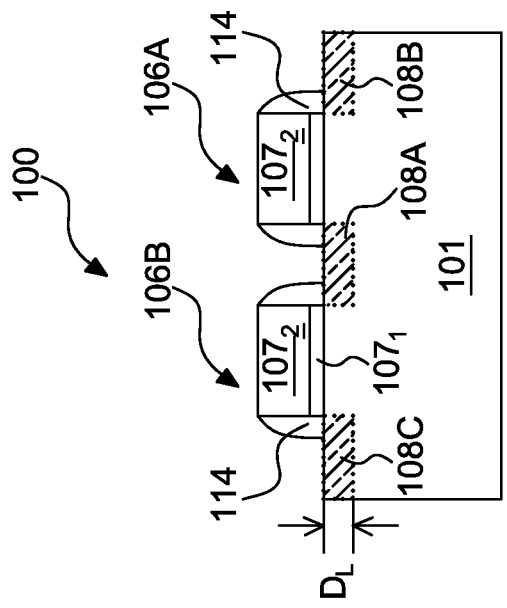
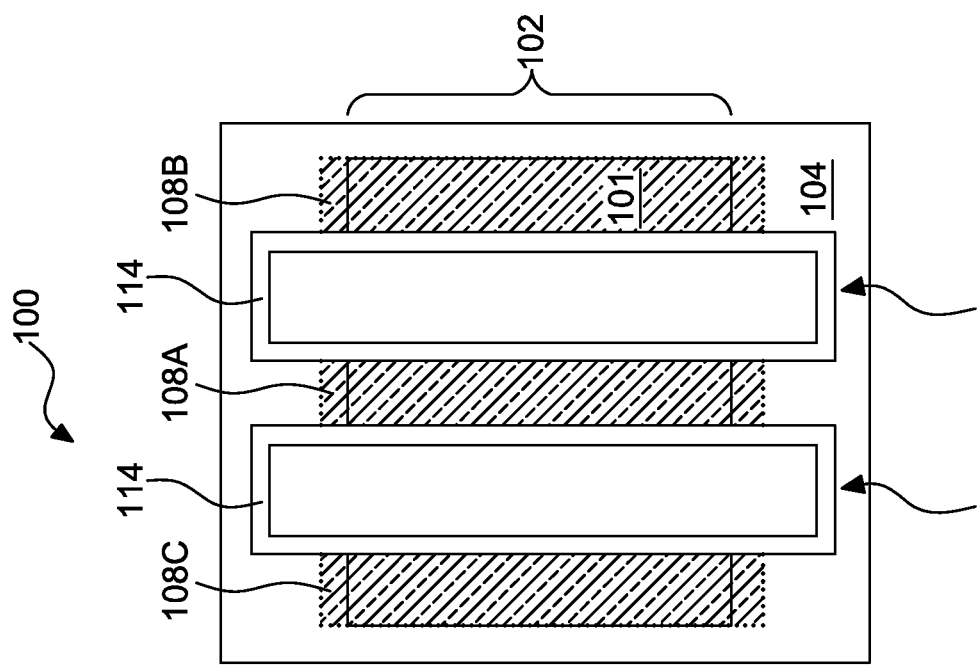
Fig. 9B
Fig. 9A

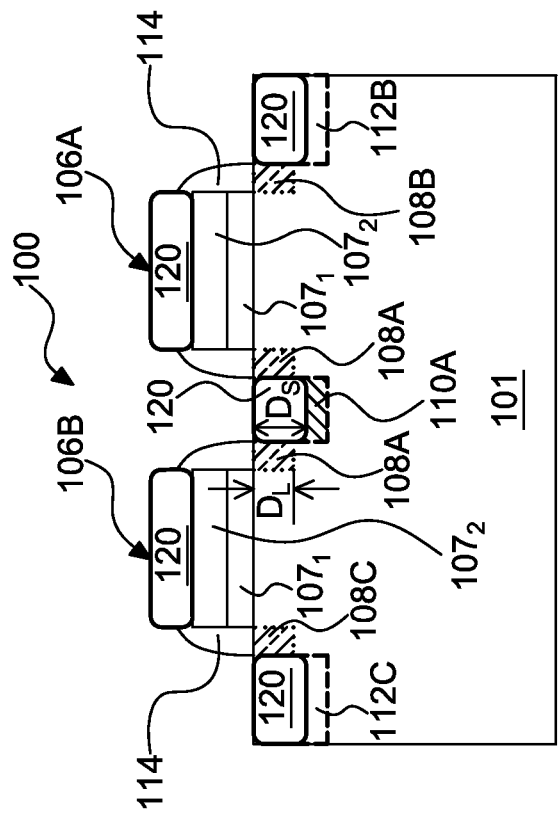
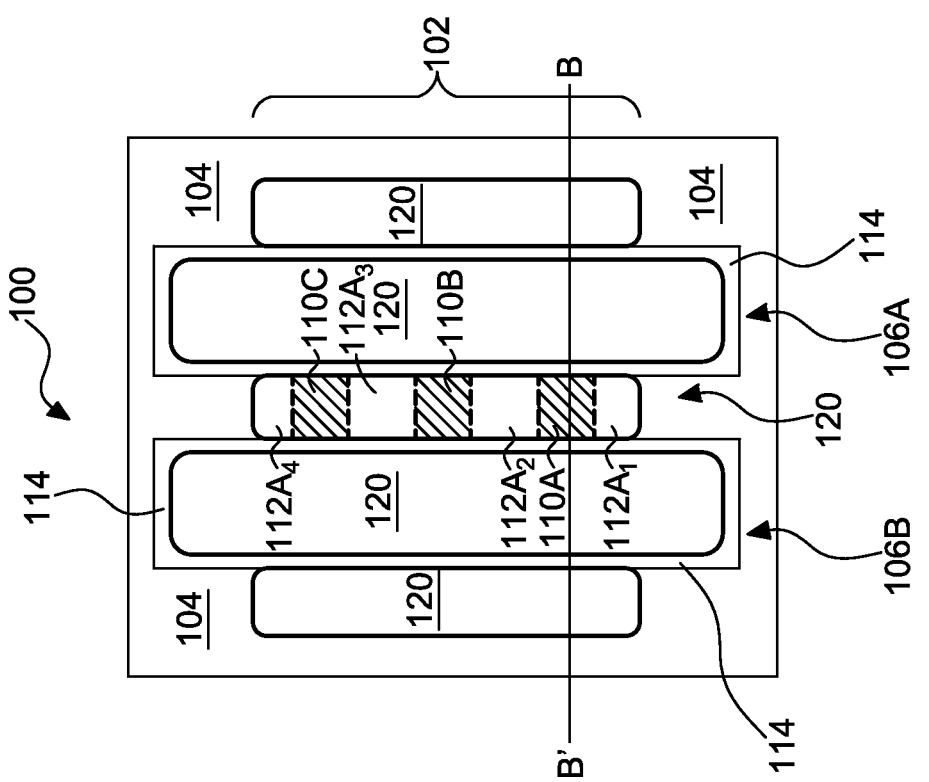
Fig. 12B
Fig. 12A

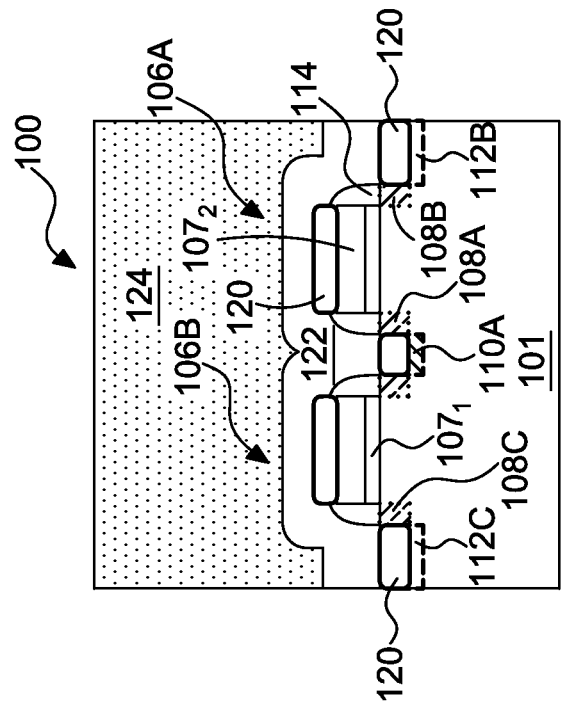
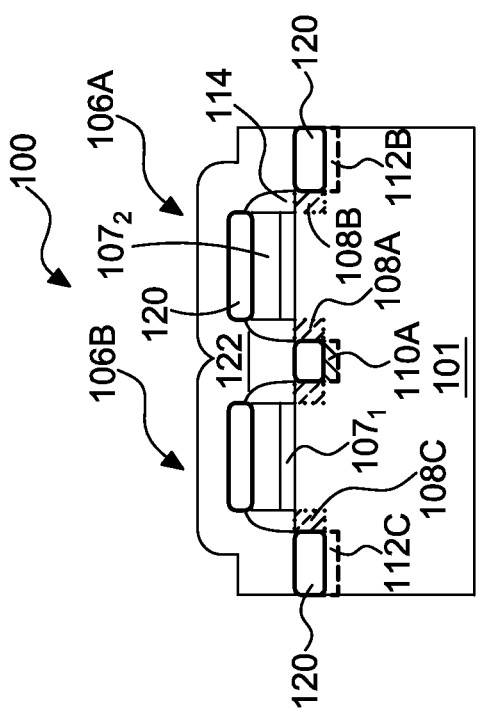

US 9,761,494 B2

SEMICONDUCTOR STRUCTURE AND METHOD OF FORMING THE SAME

TECHNICAL FIELD

The disclosure relates generally to a semiconductor structure and, more particularly, to a device having a source feature and an adjoining bulk pick-up region, and methods for forming the same.

BACKGROUND

A conventional butting contact is utilized to reduce an area of a semiconductor device so as to increase a density of the circuit thereon, and the butting contact is widely used in power metal-oxide-semiconductor field effect transistors (MOSFETs) to increase a cell density and reduce a conduction resistor. A butting contact is a node having the same electrical potential for two terminals. For example, a source/drain region of a transistor shares the contact node with an adjacent bulk pick-up region. This contact node is a butting contact. In another example, two neighboring transistors connect to the same contact node for their corresponding source/drain regions. This contact node is also a butting contact.

The semiconductor industry has progressed to shrink the semiconductor node. This scaling down process generally provides benefits by increasing production efficiency and lowering associated costs. Such scaling down has also increased the complexity of processing integrated circuits.

Although the butting contact has many advantages, a number of challenges exist in connection with developing scaled down semiconductor devices. Various techniques directed at configurations and processes of the butting contact have been implemented to try and further improve transistor device performance.

BRIEF DESCRIPTION OF THE DRAWINGS

Aspects of the present disclosure are best understood from the following detailed description and the accompanying figures. It is emphasized that, in accordance with the standard practice in the industry, various features are not drawn to scale. In fact, the dimensions of the various features may be arbitrarily increased or reduced for clarity of discussion.

FIG. 1 is a top view of a semiconductor structure of an integrated circuit having a source feature and an adjoining bulk pick-up region according to at least one embodiment.

FIG. 2 is a top view of the semiconductor structure of FIG. 1 after a salicide layer formation according to at least one embodiment.

FIGS. 7A to 15 are top views and cross-sectional views of a semiconductor structure of an integrated circuit having a source feature and an adjoining bulk pick-up region at various stages of manufacture according to one or more embodiments of the method of FIG. 6.

DETAILED DESCRIPTION

Figure 3B:
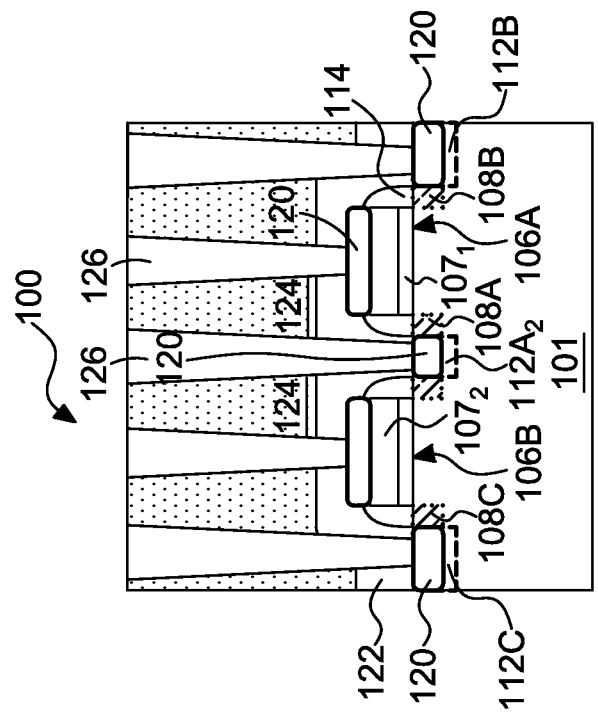
FIGS. 3A and 3B are cross-sectional views of the semiconductor structure of FIG. 2 according to at least one embodiment.

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

A plurality of semiconductor chip regions is divided on the substrate by scribe lines between the chip regions. The substrate will go through a variety of cleaning, layering, patterning, etching and doping steps to form integrated circuits. The term "substrate" herein generally refers to the bulk substrate on which various layers and device structures may be formed. In some embodiments, the substrate includes silicon or a compound semiconductor, such as GaAs, InP, Si/Ge, or SiC. Examples of such layers include dielectric layers, doped layers, polysilicon layers or conductive layers. Examples of device structures include transistors, resistors, and/or capacitors, which may be interconnected through an interconnect layer to additional integrated circuits.

FIG. 1 is a top view of a semiconductor structure 100 of an integrated circuit having a source feature (one of the heavily doped regions 112A1-4 in the lightly doped region 108A) and an adjoining bulk pick-up region 110A-C according to at least one embodiment. The semiconductor structure 100 includes a substrate having various doping configurations depending on design requirements (e.g., p-type substrate or n-type substrate). In some embodiments, the p-type refers to making holes as majority charge carriers in a semiconductor material, and the n-type refers to making electrons as majority charge carriers in a semiconductor material. In the depicted embodiment, the substrate is a p-type substrate. The semiconductor structure 100 includes a first field effect transistor region in the substrate, for example an n-channel field effect transistor (NFET) region 102. The NFET region 102 is a portion of the substrate having p-type doping configurations. The semiconductor structure 100 may further include a second field effect transistor region, for example a p-channel field effect transistor (PFET) region (not shown). The semiconductor structure 100 can further include memory cells and/or logic circuits, passive components such as resistors, capacitors, inductors, and/or fuses; and active components, such as metal-oxide-semiconductor field effect transistors (MOSFETs), complementary metal-oxide-semiconductor transistors (CMOSs), high voltage transistors, and/or high frequency transistors. The semiconductor structure 100 also includes an isolation feature 104 formed in the substrate to isolate various regions of the substrate, such as the PFET region and the NFET region.

The semiconductor structure 100 further includes various gate structures 106A and 106B formed over the NFET region 102 and the isolation feature 104. In the depicted embodiment, the gate structure 106A is disposed adjacent to the gate structure 106B. The gate structures 106A, 106B and the NFET region 102 thereunder function as gate transistors. The semiconductor structure 100 further includes at least one lightly doped region (for example 108A-C) adjoining the gate structures 106A and 106B. In the depicted embodiment, the lightly doped region 108A is disposed between the gate structures 106A and 106B. The lightly doped regions 108A-C have a first conductivity type, for example n-type. As shown in FIG. 1, dopants for lightly doped regions may be doped in the NFET region 102 and the isolation feature 104. However, only the lightly doped regions 108A-C within the NFET region 102 are functional. The semiconductor structure 100 further includes a plurality of bulk pick-up regions 110 A-C in the lightly doped region 108A. The bulk pick-up regions 110A-C have a second conductivity type, for example p-type. A distance W between each bulk pick-up region 110A-C is in a range from about 0.2 to about 10 μm.

The semiconductor structure 100 further includes a plurality of heavily doped regions 112A1-4, 112B and 112 C. The heavily doped regions 112A1-4, 112B and 112 C have the first conductivity type as the lightly doped region 108A, for example n-type. As shown in FIG. 1, dopants for the heavily doped regions may be doped in the NFET region 102 and the isolation feature 104. However, only the heavily doped regions within the NFET region 102 are functional. The heavily doped regions 112B and 112 C overlap the corresponding lightly doped regions 108B and 108C. The heavily doped regions $112A_{1-4}$ are disposed in the lightly doped region 108A not occupied by the bulk pick-up regions 110A-C. In the NFET region 102, the heavily doped regions 112B-C and the corresponding lightly doped regions 108B-C are configured as drain features of the gate structures 106A and 106B, respectively. In the NFET region 102, the heavily doped regions $112A_{1-4}$ and the lightly doped region 108A are configured as source features of the gate structures 106A and 106B. In the depicted embodiment, the gate structures 106A and 106B share the heavily doped regions $112A_{1-4}$, the lightly doped region 108A and the bulk pick-up regions 110A-C. The semiconductor structure 100 further includes spacers 114 on sidewalls of the gate structures 106A and 106B. The spacers 114 cover a portion of the lightly doped regions 108A-C.

Still referring to FIG. 1, a first current path 116 is formed during the operation of the semiconductor structure 100. The first current path 116 is from the drain feature (also referred to the heavily doped region 112B and the corresponding lightly doped region 108B), underneath the gate structure 106A (along a direction of the line B-B'), along the covered lightly doped region 108A to one of the source features (for example, the heavily doped regions $112A_2$ in the lightly doped region 108A). During the operation of the semiconductor structure 100, a second current path 118 is from the drain feature (for example, the heavily doped region 112B and the corresponding lightly doped region 108B), underneath the gate structure 106A (along a direction of the line C-C') to one of the source features (for example, the heavily doped regions $112A_2$ in the lightly doped region 108A). The above current paths 116 and 118 are examples of various current paths of the drain feature to source features for the gate structure 106A. This disclosure is not limited to the above two paths for conducting currents. Likewise, the gate structure 106B has current paths form the drain feature (also referred to the heavily doped region 112C and the corresponding lightly doped region 108C) to the source features. During the operation of the semiconductor structure 100, holes will be conducted through the bulk pick-up regions 110 A-C to prevent holes accumulated in the substrate. The distance W between each bulk pick-up region 110A-C is kept in a range from about 0.2 to about 10 μm. When the distance W between each bulk pick-up region 110A-C is larger than 10 μm, holes can not be effectively conducted to above interconnects. Hence, holes will be accumulated in the substrate. When the distance W between each bulk pick-up region 110A-C is less than 0.2 μm, the current through the first current patch 116 in the covered lightly doped region 108A will generate high impedance. The summation of the impedances generated in many covered lightly doped regions 108A reduces the device performance of the semiconductor structure 100, such as lower speed.

FIG. 2 is a top view of the semiconductor structure 100 of FIG. 1 after a salicide layer 120 formation. The salicide layer 120 is disposed on top portions of the gate structures 106A-B, the heavily doped regions 112B-C and the corresponding lightly doped regions 108B-C (also referred to the drain features), the heavily doped regions $112A_{1-4}$ and the lightly doped region 108A (also referred to the source features), and the bulk pick-up regions 110A-C. The spacers 114 and the isolation feature 104 are free of the salicide layer 120. In FIG. 2, the salicide layer 120 between the gate structures 106A-B is shown as a transparent layer for better illustration of the underlying features. The same salicide layer 120 is disposed on the source features and the bulk pick-up regions 110A-C. Hence, the source features and the bulk pick-up regions have a same electrical potential, and a "butting contact" is formed. The butting contact is a node which has the same electrical potential for two terminals, for example, the source feature and the bulk pick-up region. The butting contact connects both the source feature and the bulk pick-up region using the same node to above interconnects for electrical connection. It is not necessary for the source feature and the bulk pick-up region to have its own contact region with two nodes. The butting contact reduces an area of the semiconductor structure 100 so as to increase the density of the circuits in the semiconductor structure 100.

Figure 3A:
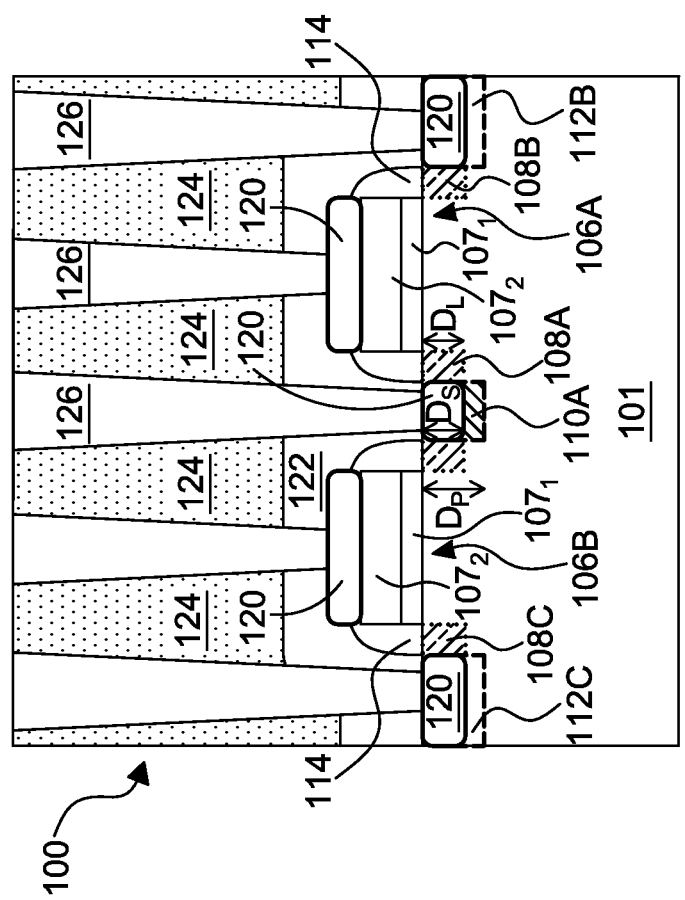

FIG. 3A is a cross-sectional view obtained from the vertical plane crossing line B-B' in FIG. 2. In FIG. 3A, a substrate 101 is a semiconductor substrate including silicon. In the depicted embodiment, the substrate 101 is a p-type substrate. The gate structure 106A is disposed adjacent to the gate structure 106B. The gate structures 106A-B includes a gate dielectric layer 1071 and a gate electrode layer 1072. The lightly doped regions 108A-C are disposed adjoining the gate structures 106A-B in the substrate 101. The lightly doped regions 108A-C have a first conductivity type, for example an n-type. The heavily doped regions 112B and 112 C disposed in the corresponding lightly doped regions 108B and 108C are configured as drain features of the gate structures 106A and 106B, respectively. The bulk pick-up region 110A is disposed in the lightly doped region 108A between the gate structures 106A and 106B. The bulk pick-up region 110A has a second conductivity type, for example a p-type. Electrically, the bulk pick-up region 110A has a sufficiently high dopant concentration of the second conductivity type to overcome a first conductivity type dopant of the lightly doped region 108A. As a result, the bulk pick-up region 110A still has the second conductivity type. The spacers 114 are disposed on sidewalls of the gate structures 106A-B. The salicide layer 120 is disposed on top portions of the gate structures 106A-B, the heavily doped regions 112B-C and the corresponding lightly doped regions 108B-C (also referred to the drain features), the bulk pick-up region 110A and the lightly doped region 108A. A dielectric cap layer 122 is disposed over the salicide layer 120 and the spacers 114. An inter-level dielectric (ILD) layer 124 is disposed over the dielectric cap layer 122. A plurality of contact plugs 126 are embedded in the ILD layer 124 and the dielectric cap layer 122 contacting the salicide layer 120.

In FIG. 3A, the bulk pick-up region 110A has a depth DP, which is substantially larger than a depth DL of the lightly doped region 108A. The salicide layer 120 has a depth DS extending into the substrate 101. The depth DS is substantially larger than the depth DL of the lightly doped region 108A. Thus, the bulk pick-up region 110A contacts the salicide layer 120. Advantageously, during the operation of the semiconductor structure 100, holes generated in the substrate 101 will be conducted through the bulk pick-up region 110 A to the salicide layer 120 and above interconnects to prevent accumulation of holes in the substrate 101. Likewise, the bulk pick-up regions 110B and 110C are also capable of conducting holes in the substrate 101 to above interconnects.

FIG. 3B is a cross-sectional view obtained from the vertical plane crossing line C-C' in FIG. 2. In FIG. 3B, the layer stacks of the semiconductor structure 100 are similar to FIG. 3A. However, in FIG. 3B, the heavily doped region $112A_2$ replaces the bulk pick-up region 110A shown in FIG. 3A. The heavily doped region $112A_2$ has a higher dopant concentration of the first conductivity type than the lightly doped regions 108A. The heavily doped region $112A_2$ and the corresponding lightly doped region 108A are configured as one of the source features shared by the gate structures 106A-B. During the operation of the semiconductor structure 100, currents may flow from drain features to the source features.

Figure 4:
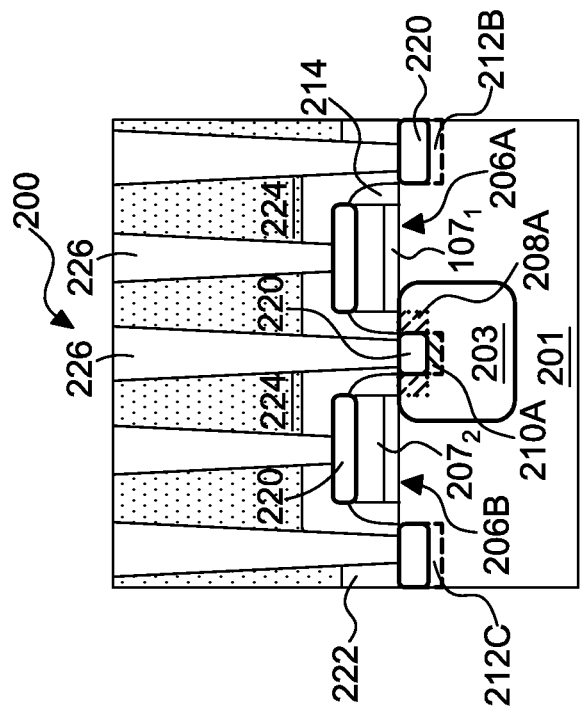
FIG. 4 is a cross-sectional view a semiconductor structure of an integrated circuit having a source feature and an adjoining bulk pick-up region according to at least one embodiment.

FIG. 4 is a cross-sectional view of a semiconductor structure 200 of an integrated circuit having a source feature and an adjoining bulk pick-up region 210A according to at least one embodiment. The semiconductor structure 200 is used the application for lateral diffusion metal-oxide-semiconductor (LDMOS) devices. Similar to FIG. 3A, FIG. 4 is the cross-sectional view obtained from the vertical plane crossing the bulk pick-up region. The cross-sectional view obtained from the vertical plane crossing the source feature is not shown. In FIG. 4, a substrate 201 is a semiconductor substrate including silicon. In the depicted embodiment, the substrate 201 is an n-type substrate. A gate structure 206A is disposed adjacent to a gate structure 206B. The gate structures 206A-B includes a gate dielectric layer 1071 and a gate electrode layer 2072. A well region 203 is disposed in the substrate 201 between the gate structures 206A-B. The well region 203 had a first conductivity type, for example a p-type. A lightly doped region 208A is disposed in the well region 203. The lightly doped region 208A had a second conductivity type, for example the n-type. A bulk pick-up region 210A is disposed in the lightly doped region 208A. The bulk pick-up region 210A has the first conductivity type, for example the p-type. Electrically, the bulk pick-up region 210A has a sufficiently high dopant concentration of the first conductivity type to overcome a second conductivity type dopant of the lightly doped region 208A. As a result, the bulk pick-up region 210A has the first conductivity type.

Still referring to FIG. 4, heavily doped regions 212B-C disposed adjoining the corresponding gate structures 206A-B in the substrate 201 are configured as drain features of the gate structures 206A and 206B, respectively. Another heavily doped region (not shown) is disposed in the lightly doped region 208A between the gate structures 206A-B. This heavily doped region is adjoining the pick-up region 210A and is configured as the source feature shared by the gate structures 206A-B. The above mentioned heavily doped regions have the second conductivity type, for example the n-type. Spacers 214 are disposed on sidewalls of the gate structures 206A-B. A salicide layer 220 is disposed on top portions of the gate structures 206A-B, the drain features, the source feature and the bulk pick-up region 210A. A dielectric cap layer 222 is disposed over the salicide layer 220 and the spacers 214. An inter-level dielectric (ILD) layer 224 is disposed over the dielectric cap layer 222. A plurality of conductive plugs 226 are embedded in the ILD layer 224 and the dielectric cap layer 222 contacting the silicide layer 220.

Figure 5:
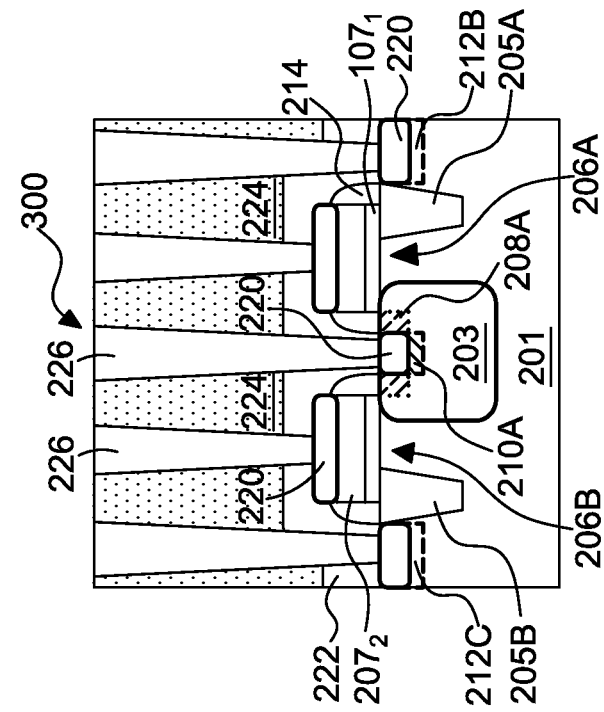
FIG. 5 is a cross-sectional view a semiconductor structure of an integrated circuit having a source feature and an adjoining bulk pick-up region according to at least one embodiment.

FIG. 5 is a cross-sectional view of a semiconductor structure 300 of an integrated circuit having a source feature and an adjoining bulk pick-up region 210A according to at least one embodiment. The semiconductor structure 300 is used the application for extended drain MOS (EDMOS) devices. In FIG. 5, the layer stacks of the semiconductor structure 300 are similar to the semiconductor structure 200 in FIG. 4. However, in the semiconductor structure 300, the gate structures 206A-B overlie a portion of isolation features 205A-B, respectively. The heavily doped regions 212B-C (also referred to the drain features) and the gate structures 206A-B are separated by the isolation features 205A-B, respectively.

Advantageously, during the operation of the semiconductor structures 200 and 300, holes generated in the well region 203 will be conducted through the bulk pick-up regions 210A to the salicide layer 220 and the above interconnects to prevent accumulation of holes in the substrate 201. The currents between the drain feature to source features for the gate structure (206A or 206B) may be conducted through various currents paths as the semiconductor structure 100. Both the source feature (not shown) and the bulk pick-up region 210A contact a same butting contact to above interconnects for electrical connection.

All the above embodiments use n-channel field effect transistors for illustration purpose. The disclosure is also applicable to p-channel field effect transistors, if the conductivity type of each feature in the above embodiments is reversed.

Figure 6:
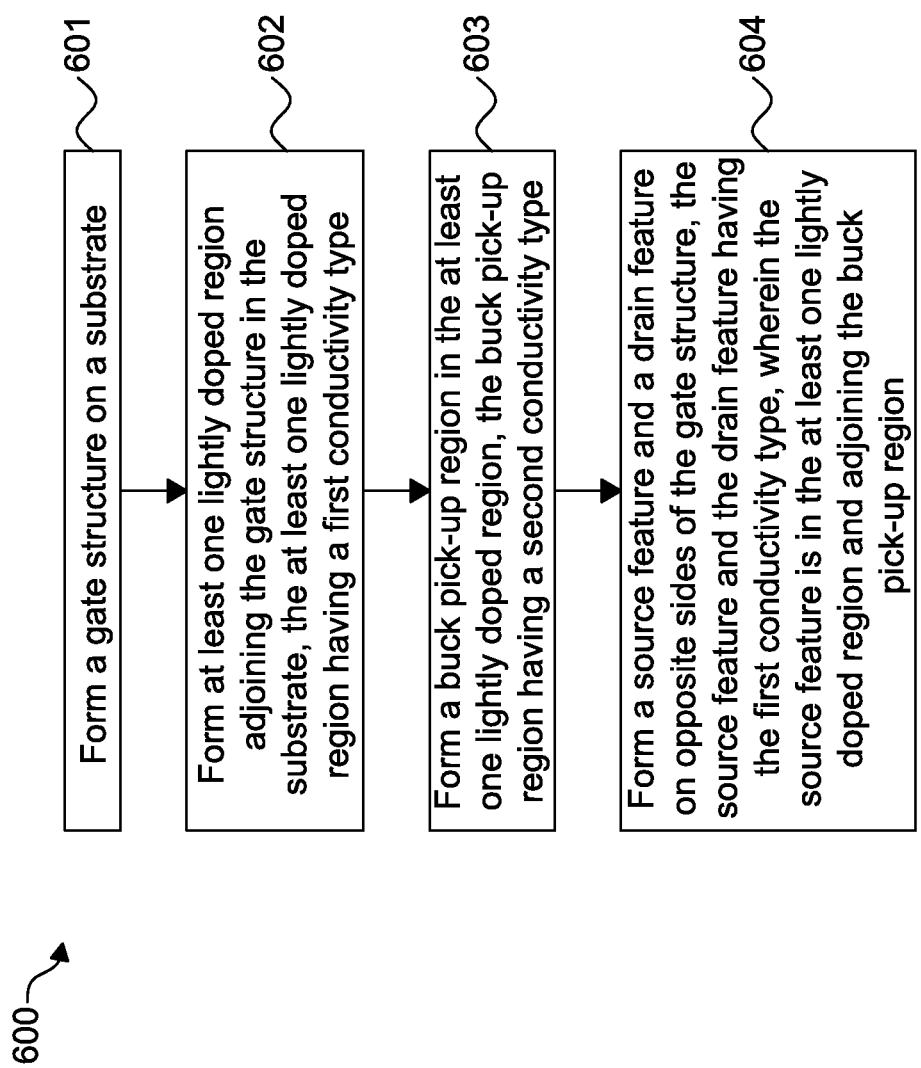
FIG. 6 is a flowchart of a method of forming a semiconductor structure of an integrated circuit having a source feature and an adjoining bulk pick-up region according to one or more embodiments.

FIG. 6 is a flowchart of a method 600 of forming a semiconductor structure of an integrated circuit having a source feature and an adjoining bulk pick-up region according to one or more embodiments of this disclosure. The method 600 begins at operation 601 in which a gate structure is formed on a substrate. Next, the method 600 continues with operation 602 in which at least one lightly doped region is formed adjoining the gate structure in the substrate. The at least one lightly doped region has a first conductivity type. The method 600 continues with operation 603 in which a bulk pick-up region is formed in the at least one lightly doped region. The bulk pick-up region has a second conductivity type. The method 600 continues with operation 604 in which a source feature and a drain feature are formed on opposite sides of the gate structure. The source feature and the drain feature have the first conductivity type. The source feature is in the at least one lightly doped region and adjoins the bulk pick-up region. In some embodiments, the fabrication sequence of operations 603 and 604 could be reversed. It should be noted that additional processes may be provided before, during, or after the method 600 of FIG. 6.

FIGS. 7A to 15 are top views and cross-sectional views of a semiconductor structure 100 of an integrated circuit having a source feature and an adjoining bulk pick-up region at various stages of manufacture according to one or more embodiments of the method of FIG. 6. Various figures have been simplified for a better understanding of the inventive concepts of the present disclosure.

The method 600 begins at operation 601 in which a gate structure is formed on a substrate. FIG. 7A is a top view of the semiconductor structure 100 after performing operation 601. FIG. 7B is a cross-sectional view obtained from the vertical plane crossing line B-B' in FIG. 7A. The substrate 101 is provided. The substrate 101 is a semiconductor substrate including silicon. The substrate 101 may be a p-type or an n-type substrate. In the depicted embodiment, the substrate 101 is the p-type substrate. Alternatively, the substrate 101 comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 101 is a semiconductor on insulator (SOI). In other alternatives, semiconductor substrate 101 may include a doped epi layer, a gradient semiconductor layer, and/or a semiconductor layer overlying another semiconductor layer of a different type, such as a silicon layer on a silicon germanium layer.

The semiconductor structure 100 further includes various field effect transistor regions in the substrate 101, for example n-channel field effect transistor (NFET) regions and p-channel field effect transistor (PFET) regions. Field effect transistor regions are active regions for forming transistors and have various doping configurations in the substrate 101. In the depicted embodiment, NFET region 102 having the p-type doping configuration is formed in the substrate 101.

The isolation feature 104 is formed in the substrate 101 to isolate various regions, for example PFET regions and NFET regions. The isolation feature 104 utilizes isolation technology, such as local oxidation of silicon (LOCOS) and/or shallow trench isolation (STI), to define and electrically isolate the various regions. In the depicted embodiment, the isolation feature 104 surrounds the NFET region 102. The isolation feature 104 comprises silicon oxide, silicon nitride, silicon oxynitride or other suitable materials having electrical isolation function.

Still referring to FIGS. 7A-B, the semiconductor structure 100 further includes various gate structures 106A-B formed on the substrate 101. In the depicted embodiment, the gate structures 106A-B are formed adjacent to one another on the NFET region 102 and overlying the isolation feature 104. The gate structures 106A-B include gate dielectric layer 1071 and gate electrode layer 1072. The gate structures 106A-B are formed by deposition, lithography patterning, etching processes, or combination thereof. The deposition processes include chemical vapor deposition (CVD), physical vapor deposition (PVD), atomic layer deposition (ALD), high density plasma CVD (HDPCVD) or combinations thereof. The lithography patterning processes include photoresist coating, exposure and developing the photoresist. The etching processes include dry etching, wet etching, other etching methods, or combinations thereof.

The gate dielectric layer 1071 is formed over the substrate 101 and includes a dielectric material, such as silicon oxide, silicon oxynitride, silicon nitride or a high-k dielectric material. Exemplary high-k dielectric materials include $HfO_2$, HfSiO, HfSiON, HfTaO, HfTiO, HfZrO or combinations thereof.

The gate electrode layer 1072 is formed over the gate dielectric layer 1071. In the present embodiment, the gate electrode layer 1072 is a polycrystalline silicon (polysilicon) layer. The polysilicon layer may be doped for proper conductivity. In some embodiments, the polysilicon layer may be replaced in a subsequent gate replacement process if a high K metal gate is to be formed. In some embodiments, a material of the high K metal gate includes an n-metal layer and a conductive material layer. The n-metal layer includes a metal-based material having a work function compatible to form an n-type transistor. For one example, the n-metal layer has a work function of equal to or less than about 4.2 eV. The conductive material layer includes tungsten or aluminum according to various embodiments. In other embodiments, a material of high K metal gate includes a p-metal layer. The application of an n-metal or a p-metal may depend on the type of device being fabricated, such as an NMOS or a PMOS device.

Figure 8B:
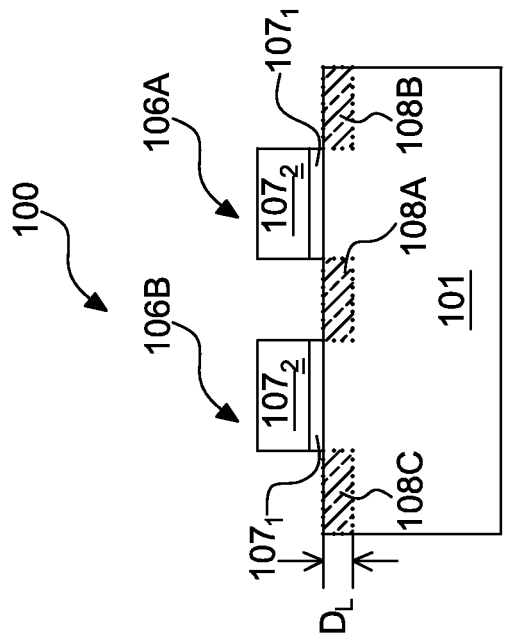
Figure 8A:
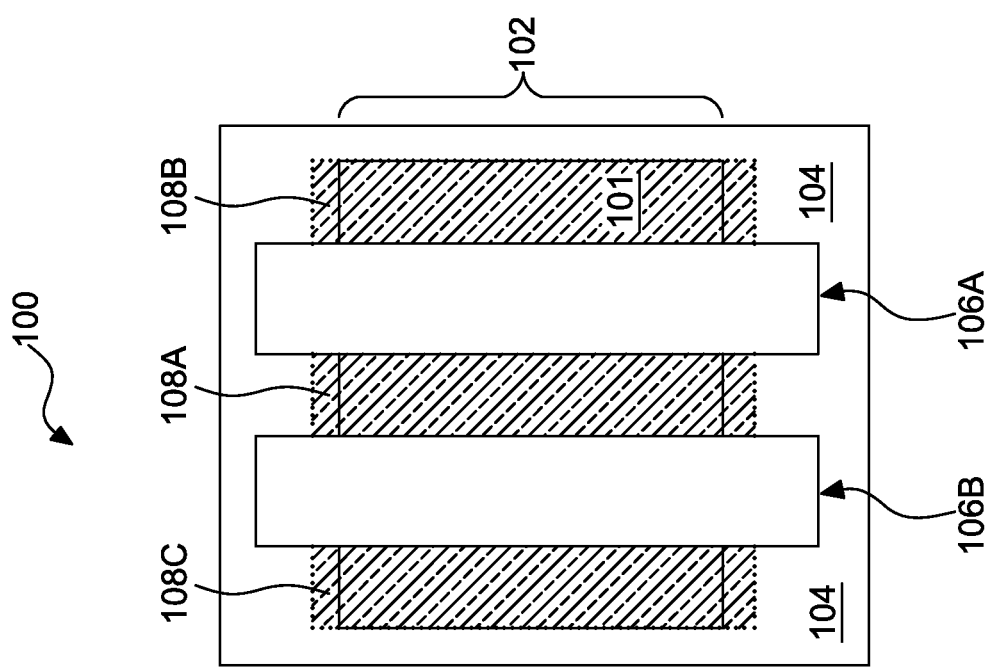

The method 600 continues with operation 602 in which at least one lightly doped region is formed adjoining the gate structure in the substrate. FIGS. 8A and 8B are a top view and a cross-sectional view of the semiconductor structure 100 after performing operation 602, respectively. An ion implantation process is performed over the semiconductor structure 100 to form various lightly doped regions 108A-C in the substrate 101. An ion source of the ion implantation process comprises phosphors (P) or arsenic (As). In the present embodiment, the ion source is arsenic. A range of energy applied in the ion implantation is between about 3 to 5 Kev. A dosage used in the ion implantation is from about 1E14 to about 1E15 atoms/cm$^2$. By implanting ions with different energy values, different depths of the lightly doped regions 108A-C may be achieved. In the present embodiment, a depth $D_L$ of the lightly doped regions 108A-C for arsenic is in a range from about 3 nm to about 10 nm. In one embodiment, the ion implantation process is performed over the entire the semiconductor structure 100. For example, various lightly doped regions 108A-C are formed adjoining the gate structures 106A-B. In another embodiment, the ion implantation process is performed on selective locations. For example, only the lightly doped region 108A is formed between the gate structures 106A-B while the regions 108B-C are not implanted. As shown in FIG. 8A, the ion implantation process may be performed in the NFET region 102 and the isolation feature 104. However, only the lightly doped regions 108A-C within the NFET region 102 is functional.

FIGS. 9A and 9B are a top view and a cross-sectional view of the semiconductor structure 100, respectively, after forming spacers 114. In the depicted embodiment, a material of spacers 114 is formed by blanket deposition over the semiconductor structure 100. Then, the material of spacers 114 is anisotropically etched to form spacers 114 as illustrated in FIGS. 9A-B. The spacers 114 are positioned adjacent sidewalls of the gate structures 106A-B and cover a portion of the lightly doped regions 108A-C. The spacers 114 may include a dielectric material, such as silicon oxide or silicon oxynitride.

Figures 10A, 10B:
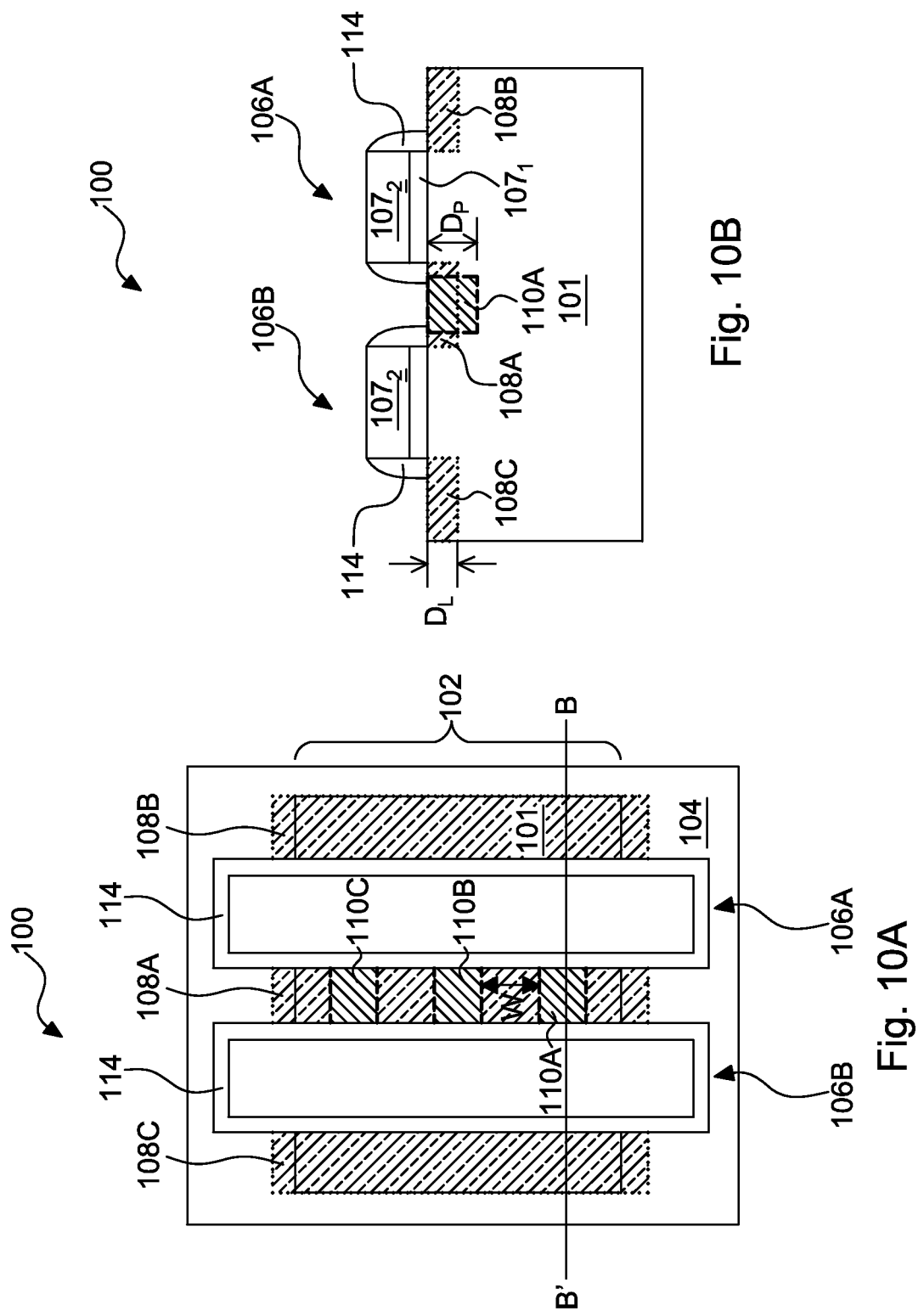

The method 600 continues with operation 603 in which the bulk pick-up region is formed in the at least one lightly doped region. FIG. 10A is a top view of the semiconductor structure 100 after forming performing operation 603. FIG. 10B is a cross-sectional view obtained from the vertical plane crossing line B-B' in FIG. 10A. An ion implantation process is selectively performed over the semiconductor structure 100. The plurality of bulk pick-up regions 110A-C are formed in the lightly doped region 108A not covered by the spacer 114 between the gate structures 106A-B. The bulk pick-up regions 110A-C have a second conductivity type, for example p-type. An ion source of the ion implantation process comprises boron, $BF_2$, gallium or indium. In the present embodiment, the ion source is boron. A range of energy applied in the ion implantation is between about 5 to 25 Kev. A dosage used in the ion implantation is from about 1E15 to about 5E15 atoms/cm$^2$. In some embodiments, bulk pick-up regions 110A-C may be formed by several implanting processes. The bulk pick-up regions are separated from each other by a distance W in a range from about 0.2 to about 10 μm. The bulk pick-up regions 110A-C have a depth $D_P$, which is substantially larger than the depth $D_L$ of the lightly doped regions 108A-C. Electrically, the bulk pick-up regions 110A-C have a sufficiently high dopant concentration of the second conductivity type to overcome a first conductivity type dopant of the lightly doped regions 108A-C. As a result, the bulk pick-up regions 110A-C have the second conductivity type.

Figure 11A:
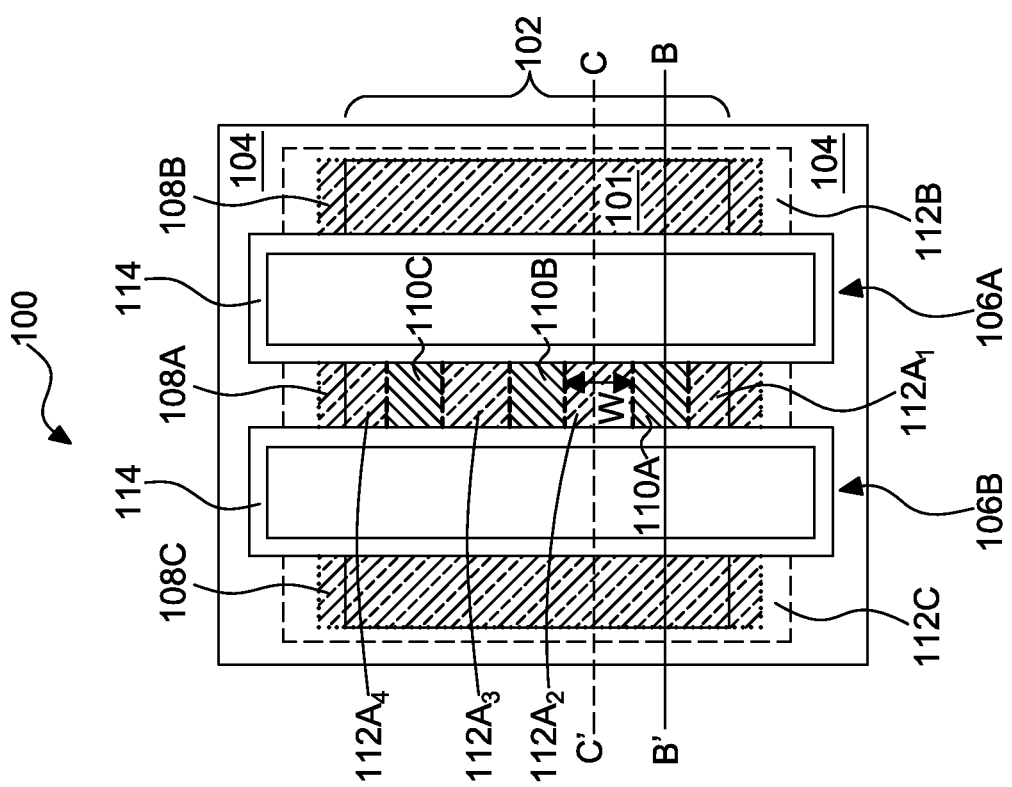
Figure 11B:
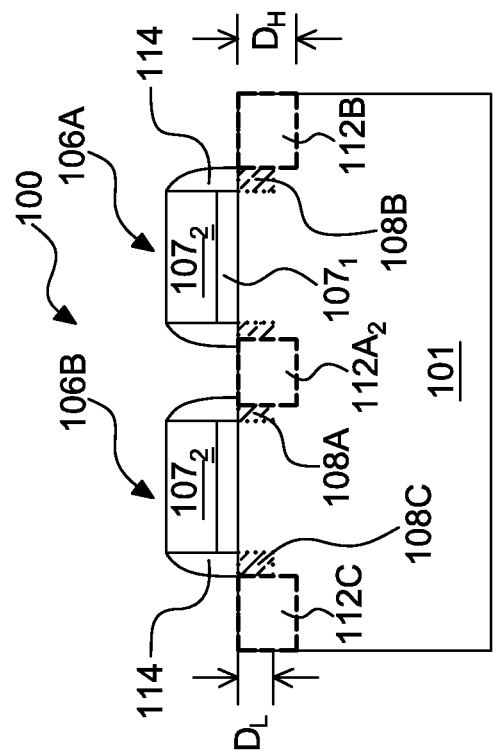
Figure 11C:
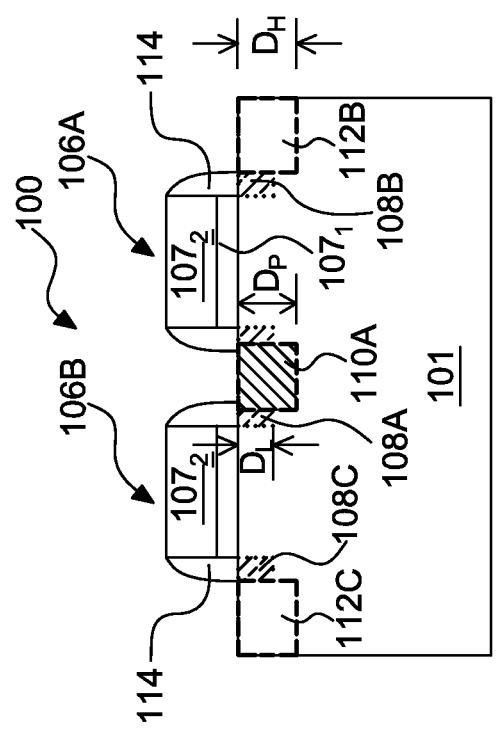

The method 600 continues with operation 604 in which a source feature and a drain feature are formed on opposite sides of the gate structure. FIG. 11A is a top view of the semiconductor structure 100 after forming performing operation 604. FIG. 11B is a cross-sectional view obtained from the vertical plane crossing line B-B' in FIG. 11A. FIG. 11C is a cross-sectional view obtained from the vertical plane crossing line C-C' in FIG. 11A.

In FIGS. 11A-C, an ion implantation process is performed over the semiconductor structure 100 to form various heavily doped regions $112A_{1-4}$, 112B and 112 C. The heavily doped regions $112A_{1-4}$, 112B and 112 C has the same first conductivity type as the lightly doped regions 108A-C, for example n-type. As shown in FIG. 11A, the ion implantation process may be performed in the NFET region 102 and the isolation feature 104. However, only the heavily doped regions within the NFET region 102 are functional. During the ion implantation process, the bulk pick-up regions 110A-C are blocked with a mask layer, for example a photo resist layer. The heavily doped regions $112A_{1-4}$ are disposed in the lightly doped region 108A not occupied by the bulk pick-up regions 110A-C. The heavily doped regions 112B and 112 C overlap the corresponding lightly doped regions 108B and 108C. In the NFET region 102, the heavily doped regions 112B-C and the corresponding lightly doped regions 108B-C are configured as drain features of the gate structures 106A and 106B, respectively. In the NFET region 102, the heavily doped regions $112A_{1-4}$ and the lightly doped region 108A are configured as source features of the gate structures 106A and 106B. The heavily doped regions $112A_{1-4}$ adjoin the bulk pick-up regions 110A-C. The bulk pick-up regions 110A-C are separated from each other by one of the heavily doped region $112A_{1-4}$.

An ion source of the ion implantation process for the heavily doped regions comprises P, or As. The heavily doped regions $112A_{1-4}$ have a depth $D_H$ substantially larger than the depth $D_L$ of the lightly doped regions 108A-C. The heavily doped regions $112A_{1-4}$ have a higher dopant concentration of first conductivity type than the lightly doped regions 108A-C.

FIGS. 12A and 12B are a top view and a cross-sectional view of the semiconductor structure 100 after forming a salicide layer 120, respectively. FIG. 12B is the cross-sectional view obtained from the vertical plane crossing line B-B' in FIG. 12A. In some embodiments, a metal layer (not shown) is formed over the entire semiconductor structure 100. A thermal annealing process is applied to the metal layer such that the metal layer, the gate structures 106A-B and the substrate 101 react to form the salicide layer 120. A wet chemical etching process rinses off the unreacted metal layer, leaving only the salicide layer 120. The salicide layer 120 is disposed on top portions of the gate structures 106A-B, the heavily doped regions 112B-C in the corresponding lightly doped regions 108B-C (also referred to the drain features), the heavily doped regions $112A_{1-4}$ in the lightly doped region 108A (also referred to the source features), and the bulk pick-up regions 110A-C. The spacers 114 and the isolation feature 104 are free of the salicide layer 120. In one example, the salicide layer 120 comprises silicon and a metal including at least one of Ti, Co, W, Ta, Ni, or Mo. The salicide layer 120 has a depth $D_S$ extending into the substrate 101. The depth $D_S$ is substantially larger than the depth $D_L$ of the lightly doped regions 108A-C. Thus, the bulk pick-up regions 110A-C contact the salicide layer 120. Likewise, the heavily doped regions $112A_{1-4}$ and 112B-C contact the salicide layer 120.

Advantageously, the same salicide layer 120 is disposed on both the source features and the bulk pick-up regions 110A-C. Hence, the source features (the heavily doped regions $112A_{1-4}$ in the lightly doped region 108A) and the bulk pick-up regions have the same electrical potential. One source feature and one adjacent bulk pick-up region form a "butting contact," which is a node having the same electrical potential for two terminals, for example, the source feature and the bulk pick-up region. The butting contact configuration of the source feature (for example $112A_1$) and the adjoining bulk pick-up region (for example 110A) in the same lightly doped region (for example 108A) increases the density of the circuits in the semiconductor structure 100 with one node. This configuration prevents die area waste in creating two nodes for the source feature and the bulk pick-up region connection. The device characteristics, such as device speed or break down voltage, in various embodiments in this disclosure could keep good performances by providing various current paths between the source features and the drain features in the challenges with scaled down semiconductor devices.

FIG. 13 is a cross-sectional view of the semiconductor structure 100 of FIG. 12B after forming the dielectric capping layer 122. The dielectric capping layer 122 is conformal with a uniform thickness over surface features. In one example, the dielectric capping layer 122 comprises silicon nitride or silicon oxynitride. The dielectric capping layer 122 formation method may include chemical vapor deposition (CVD), plasma enhanced CVD (PECVD) or atomic layer deposition (ALD).

FIG. 14 is a cross-sectional view of the semiconductor structure 100 after forming the inter-level dielectric (ILD) layer 124. The ILD layer 124 is blanket formed over the dielectric capping layer 122. A planarization process including a chemical mechanical polishing (CMP) process or an etching process may be further applied to planarize the ILD layer 124. The ILD layer 124 may include silicon oxide, spin-on glass (SOG), fluorinated silica glass (FSG) or other suitable dielectric materials. The ILD layer 124 may be formed by CVD, low pressure CVD (LPCVD), high density plasma (HDP) deposition or spinning on glass.

Figure 15:
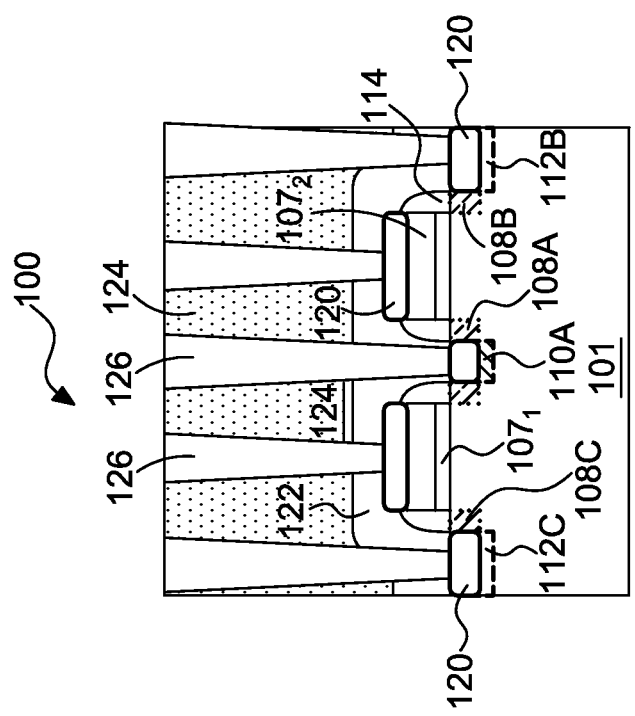

FIG. 15 is a cross-sectional view of the semiconductor structure 100 after forming contact plugs 126. A plurality of openings (not shown) are etched into the ILD layer 124 and the dielectric capping layer 122 to expose a portion of the salicide layer 120. The dielectric capping layer 122 is used as an etching stop layer and has a high etching selectivity with respect to the ILD layer 124 in the etching process for forming the plurality of openings. The openings could be accurately controlled to land on the top surface of the salicide layer 120. A conductive material may overfill the openings in the ILD layer 124 and the dielectric capping layer 122. The conductive material may include copper or copper alloys, aluminum or tungsten. The possible formation methods include electroless plating, sputtering, electro plating or chemical vapor deposition (CVD). The excess conductive material outside of the openings is removed through a suitable process such as chemical mechanical polishing (CMP). The contact plugs 126 having the conductive material are formed on the salicide layer 120.

All the above embodiments in FIGS. 7A to 15 use n-channel field effect transistors for illustration purpose. The disclosure is also applicable to p-channel field effect transistors if the conductivity type of each feature in the above embodiments is reversed.

It should be noted that additional process may be provided after the process 600 to complete fabrication of an integrated circuit. The processes to complete fabrication are discussed briefly below. A multilayer interconnection (MLI) including metal layers and inter-metal dielectric (IMD) is formed over the contact plugs 126 to electrically connect various features or structures of the semiconductor structure 100. The multilayer interconnection includes vertical interconnects, such as conventional vias or contacts, and horizontal interconnects, such as metal lines. A passivation layer is formed over the multilayer interconnection to prevent or decrease moisture, mechanical, and radiation damage to the integrated circuits. A metal pad is formed and extends into the passivation layer to contact a top most layer of the multilayer interconnection. The metal pad provides electrical connection for the integrated circuits formed on substrate 101 to other outside components.

An aspect of the disclosure describes a semiconductor structure. The semiconductor structure includes a gate structure disposed on a substrate. At least one lightly doped region adjoins the gate structure in the substrate. The at least one lightly doped region has a first conductivity type. A source feature and a drain feature are on opposite sides of the gate structure in the substrate. The source feature and the drain feature have the first conductivity type. The source feature is in the at least one lightly doped region. A bulk pick-up region adjoins the source feature in the at least one lightly doped region. The bulk pick-up region has a second conductivity type.

Another aspect of the disclosure describes a semiconductor structure. The semiconductor structure includes a first gate structure and a second adjacent gate structure disposed on a substrate. A well region is disposed in the substrate between the first gate structure and the second gate structure. The well region has a first conductivity type. A lightly doped region is disposed in the well region and has a second conductivity type. A heavily doped region is disposed in the lightly doped region and has the second conductivity type. A bulk pick-up region adjoins the heavily doped region in the lightly doped region. The bulk pick-up region has the first conductivity type.

The present disclosure also describes an embodiment of a method of forming a semiconductor structure. The method includes forming a gate structure on a substrate. At least one lightly doped region is formed adjoining the gate structure in the substrate. The at least one lightly doped region has a first conductivity type. A bulk pick-up region is formed in the at least one lightly doped region. The bulk pick-up region has a second conductivity type. A source feature and a drain feature are formed on opposite sides of the gate structure. The source feature and the drain feature have the first conductivity type. The source feature is in the at least one lightly doped region and adjoins the bulk pick-up region.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a first gate structure disposed on a substrate;
   at least one lightly doped region, at least a portion of the at least one lightly doped region having a first conductivity type adjoining the first gate structure in the substrate;
   a source feature and a drain feature having the first conductivity type on opposite sides of the first gate structure in the substrate, wherein a top surface of the source feature is aligned with a top surface of the lightly doped region;
   a first bulk pick-up region having a second conductivity type adjoining the source feature in the at least one lightly doped region;
   a salicide layer on the source feature and the first bulk pick-up region, the salicide layer extends into the substrate to a depth $D_S$, and the depth $D_S$ is larger than a depth $D_L$ of the at least one lightly doped region; and
   a well region in the substrate, wherein the well region has the second conductivity type,
      wherein the at least one lightly doped region, the source feature and the first bulk pick-up region are within the well region.

2. The semiconductor structure of claim 1, further comprising a second bulk pick-up region adjoining the source feature and opposite to the first bulk pick-up region.

3. The semiconductor structure of claim 2, wherein the first bulk pick-up region and the second bulk pick-up region are separated by a distance W in a range from about 0.2 μm to about 10 μm.

4. The semiconductor structure of claim 1, wherein the first bulk pick-up region comprises boron in a dosage range from about 1E15 to 5E15/cm$^2$.

5. The semiconductor structure of claim 1, further comprising a contact plug disposed on the salicide layer.

6. The semiconductor structure of claim 1, further comprising a second gate structure adjacent to the first gate structure, wherein the second gate structure shares the source feature and the first bulk pick-up region of the first gate structure.

7. The semiconductor structure of claim 6, wherein the salicide layer covers an entirety of an upper-most surface of the first bulk pick-up region exposed between spacers on sidewalls of the first gate structure and the second gate structure.

8. The semiconductor structure of claim 1 further comprising spacers on sidewalls of the first gate structure covering a portion of the at least one lightly doped region, wherein a current path is from the drain feature, underneath the first gate structure, along the covered lightly doped region to the source feature.

9. The semiconductor structure of claim 1, further comprising a spacer on a sidewall of the first gate structure, wherein a sidewall of the first bulk pick-up region extends underneath the spacer.

10. The semiconductor structure of claim 1, wherein a top surface of the salicide layer is coplanar with a top surface of the at least one lightly doped region.

11. A semiconductor structure comprising:
- a first gate structure and a second adjacent gate structure disposed on a substrate, wherein the first gate structure is separated from the second adjacent gate structure in a first direction parallel to a top surface of the substrate;
- a well region disposed in the substrate between the first gate structure and the second gate structure, the well region having a first conductivity type;
- a lightly doped region disposed in the well region, the lightly doped region having a second conductivity type;
- a heavily doped region disposed in the lightly doped region, the heavily doped region having the second conductivity type;
- a first bulk pick-up region adjoining the heavily doped region, the first bulk pick-up region having the first conductivity type; and
- a salicide layer on the heavily doped region and the first bulk pick-up region, the salicide layer extends into the substrate to a depth $D_S$, and the depth $D_S$ is larger than a depth $D_L$ of the lightly doped region,
- wherein sidewalls of the first bulk pick-up region are aligned with sidewalls of the heavily doped region in a second direction parallel to the top surface of the substrate and perpendicular to the first direction,
- wherein the lightly doped region, the heavily doped region and the first bulk pick-up region are within the well region.

12. The semiconductor structure of claim 11, further comprising a second bulk pick-up region in the lightly doped region, wherein the heavily doped region is between the first bulk pick-up region and the second bulk pick-up region.

13. The semiconductor structure of claim 12, wherein the first bulk pick-up region and the second bulk pick-up region are separated by a distance W in a range from about 0.2 µm to about 10 µm.

14. The semiconductor structure of claim 11, wherein the first bulk pick-up region comprises boron in a dosage range from about 1E15 to 5E15/cm².

15. The semiconductor structure of claim 11, further comprising a contact plug disposed on the salicide layer.

16. A semiconductor structure comprising:
- a first gate structure and an adjacent second gate structure disposed on a substrate;
- a well region disposed in the substrate between the first gate structure and the second gate structure, the well region having a first conductivity type;
- a lightly doped region disposed in the well region, the lightly doped region having a second conductivity type;
- a first heavily doped region disposed in the lightly doped region, the first heavily doped region having the second conductivity type, wherein a top surface of the first heavily doped region is aligned with a top surface of the lightly doped region;
- a source feature and a drain feature on opposite sides of the first gate structure in the substrate, wherein a top surface of the source feature is aligned with a top surface of the lightly doped region;
- an isolation feature in the substrate, wherein at least one of the first gate structure or the second gate structure overlies the isolation feature;
- a first bulk pick-up region adjoining the first heavily doped region in the lightly doped region, the first bulk pick-up region having the first conductivity type;
- a salicide layer on the source feature and the first bulk pick-up region, the salicide layer extends into the substrate to a depth $D_S$, and the depth $D_S$ is larger than a depth $D_L$ of the lightly doped region, wherein a top surface of the salicide layer is coplanar with a top surface of the lightly doped region; and further
- wherein the lightly doped region, the source feature and the first bulk pick-up region are within the well region.

17. The semiconductor structure of claim 16, wherein the isolation feature is positioned between at least one of the first gate structure or the second gate structure and a second heavily doped region disposed in the substrate.

18. The semiconductor structure of claim 16, wherein the first gate structure is separated from the second adjacent gate structure in a first direction parallel to a top surface of the substrate, and sidewalls of the first bulk pick-up region are aligned with sidewalls of the first heavily doped region in a second direction parallel to the top surface of the substrate and perpendicular to the first direction.

* * * * *